United States Patent [19]
Statz et al.

[11] Patent Number: 5,825,601
[45] Date of Patent: Oct. 20, 1998

[54] POWER SUPPLY ESD PROTECTION CIRCUIT

[75] Inventors: Timothy V. Statz, Minneapolis, Minn.; Dongwook Drew Suh, Freemont, Calif.; Kevin Spielberger, Eden Prairie, Minn.

[73] Assignee: LSI Logic Corporation, Milpitas, Calif.

[21] Appl. No.: 876,925

[22] Filed: Jun. 16, 1997

[51] Int. Cl.⁶ .................................................. H02H 3/22
[52] U.S. Cl. ............................................. 361/56; 361/111
[58] Field of Search ................. 361/56, 91, 111

[56] References Cited

U.S. PATENT DOCUMENTS

| | | | |
|---|---|---|---|
| 5,208,719 | 5/1993 | Wei | 361/56 |
| 5,311,391 | 5/1994 | Dungan et al. | 361/56 |
| 5,463,520 | 10/1995 | Nelson | 361/56 |
| 5,594,611 | 1/1997 | Consiglio et al. | 361/118 |

*Primary Examiner*—Jeffrey A. Gaffin
*Assistant Examiner*—Michael J. Sherry
*Attorney, Agent, or Firm*—Westman, Champlin & Kelly, P.A.

[57] ABSTRACT

An electrostatic discharge (ESD) protection circuit includes first and second supply terminals, a current source, a shunt transistor, an inverter and a voltage level shifting device. The shunt transistor is coupled between the first and second supply terminals and has a control terminal. The inverter includes an input coupled to the current source, an output coupled to the control terminal of the shunt transistor and pull-up and pull-down transistors coupled between the first and second supply terminals. The pull-up and pull-down transistors have control terminals which are coupled to the input. The voltage level shifting device is coupled between the input and the control terminal of one of the pull-up and pull-down transistors.

15 Claims, 3 Drawing Sheets

POWER SUPPLY ESD PROTECTION CIRCUIT

BACKGROUND OF THE INVENTION

The present invention relates to semiconductor integrated circuits and, more particularly, to a power supply ESD protection circuit which reduces on-die capacitance requirements.

Electrostatic discharge (ESD) is an event that can occur during the handling or processing of semiconductor devices. During a typical ESD event, a large amount of charge is deposited on a pad of an integrated circuit. If the charge is sufficient to increase voltage levels above those the circuit is intended to operate under, damage to the semiconductor devices within the circuit can occur.

Complementary Metal-Oxide Semiconductor (CMOS) devices are particularly susceptible to damage from ESD because CMOS devices have a thin gate oxide layer. For many years, signal pins on CMOS devices have been protected by various types and combinations of resistors, punch-through devices, diodes, parasitic bipolar transistors and silicon-controlled rectifiers (SCRs). Power supply pins have been left unprotected for the most part due to a large power supply capacitance that exists on the integrated circuit and the relative robustness of the semiconductor devices. As device dimensions continue to shrink, the semiconductor devices become less robust. Power supply nodes become more susceptible to ESD damage and should be protected.

SUMMARY OF THE INVENTION

The electro static discharge (ESD) protection circuit of the present invention includes first and second supply terminals, a current source, a shunt transistor, an inverter and a voltage level shifting device. The shunt transistor is coupled between the first and second supply terminals and has a control terminal. The inverter includes an input coupled to the current source, an output coupled to the control terminal of the shunt transistor and pull-up and pull-down transistors coupled between the first and second supply terminals. The pull-up and pull-down transistors each have a control terminal, with one of the control terminals being coupled to the input and the other of the control terminals being coupled to the input through the voltage level shifting device.

In one embodiment, the voltage level shifting device includes a level shifting transistor coupled as a source-follower between the current source and the control terminal of one of the pull-up and pull-down transistors. A load capacitor is coupled in series with the current source, between the first and second supply terminals. The load capacitor is formed by a load transistor having a gate capacitance. The gate capacitance of the load transistor is small when the channel of the transistor is not inverted and large when the channel is inverted. The level shifting transistor increases the voltage that is required at the input of the inverter to change the state of the inverter and turn off the shunt transistor. This allows the load transistor to charge above its threshold voltage and into the high gate capacitance region. With a higher effective gate capacitance, the load transistor can be fabricated in a much smaller area and still provide the sufficient load capacitance for the protection circuit.

Another aspect of the present invention includes an integrated circuit die having a plurality of semiconductor cells and first and second power supply conductors. The supply conductors have different relative polarities and are electrically coupled to the plurality of semiconductor cells. A protection circuit according to the present invention is coupled between the first and second power supply conductors.

DETAILED DESCRIPTION OF THE PREFERRED EMBODIMENTS

Figure 1:
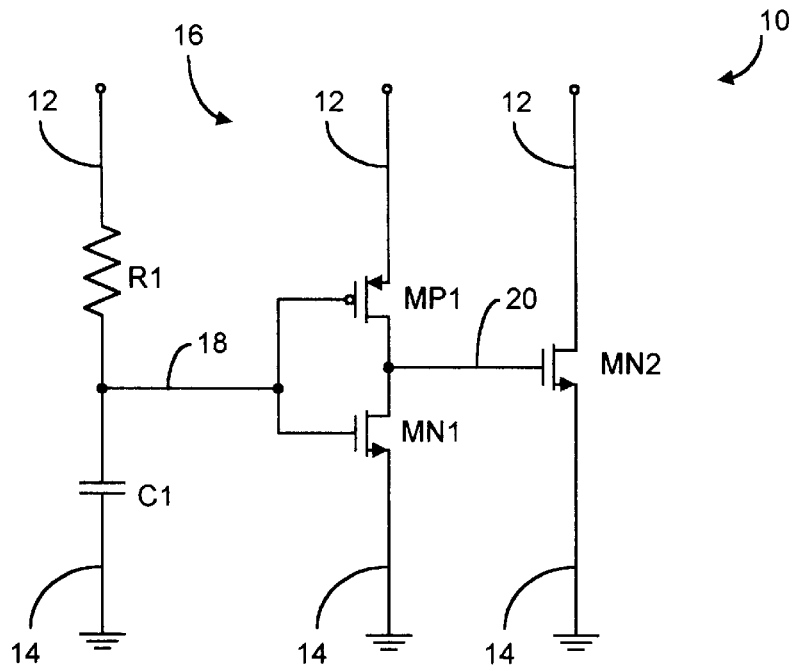
FIG. 1 is a schematic diagram of a power supply ESD protection circuit according to the prior art.

FIG. 1 is a schematic diagram of a power supply ESD protection circuit of the prior art. Circuit 10 includes current source resistor R1, load capacitor C1, N-channel transistors MN1 and MN2 and P-channel transistor MP1. Current source resistor R1 and load capacitor C1 are coupled together in series between supply terminals 12 and 14. N-channel transistor MN1 is a pull-down transistor having a gate coupled to node 18, a drain coupled to a node 20 and a source coupled to supply terminal 14. P-channel transistor MP1 is a pull-up transistor having a gate coupled to node 18, a source coupled to supply terminal 12 and a drain coupled to node 20. Transistors MN1 and MP1 form an inverter 16 which has an input at node 18 and an output at node 20. N-channel transistor MN2 has a gate coupled to node 20, a drain coupled to supply terminal 12 and a source coupled to supply terminal 14.

Transistor MN2 is a shunt transistor which shunts current between supply terminals 12 and 14 during ESD events in which a positive charge is deposited on supply terminal 12 or a negative charge is deposited on supply terminal 14. The sizes of the various components in circuit 10 are selected such that the deposited charge is dissipated without allowing unacceptable node voltages.

Before an ESD event occurs, all nodes in circuit 10 are considered to be at nearly equal voltage potentials. As supply terminal 12 is charged to a positive voltage relative to supply terminal 14 by an ESD event, node 18 is initially low. As long as the ESD event is large enough to bring supply terminal 12 above the P-channel threshold voltage of transistor MP1, transistor MP1 turns on, pulling node 20 high. With node 20 high, transistor MN2 turns on and shunts current from supply terminal 12 to supply terminal 14. Once capacitor C1 charges up through resistor R1 to the N-channel threshold voltage of transistor MN1, transistor MN1 turns on and pulls the output of inverter 16 low, at node 20. With node 20 low, transistor MN2 turns off and stops shunting current between supply terminals 12 and 14.

Capacitor C1 preferably has a very large capacitance such that the time constant at node 18 is long enough that transistor MN1 does not begin to pull node 20 low and turn off transistor MN2 before the ESD event has terminated. In typical CMOS processes where no additional steps are taken to make area efficient capacitance possible, there are essentially two methods of creating large capacitances. One method is to use the existing parallel plate capacitance between metal or polysilicon layers to form capacitor C1. This provides a linear capacitor in which the load capacitance is independent of the applied voltage, but requires a very large amount of silicon area to achieve the necessary capacitance. In the other method, capacitor C1 is formed by the gate capacitance of a transistor. This method provides a large gate capacitance in a small area, but the gate capacitance is non-linear. The gate capacitance is small until the voltage applied across the transistor is sufficient to cause inversion in the channel. Thereafter, the gate capacitance increases substantially.

In circuit 10, if the load capacitor were implemented with a transistor, the channel of the transistor would become inverted at approximately the same time as the channel of transistor MN1. The current shunting transistor MN2 therefore turns off once node 18 reaches the threshold voltage of the load transistor. The time constant for turning off transistor MN2 is therefore based primarily on the low gate capacitance region of the load transistor. As a result, the load transistor must be very large to provide the necessary gate capacitance.

Figure 2:
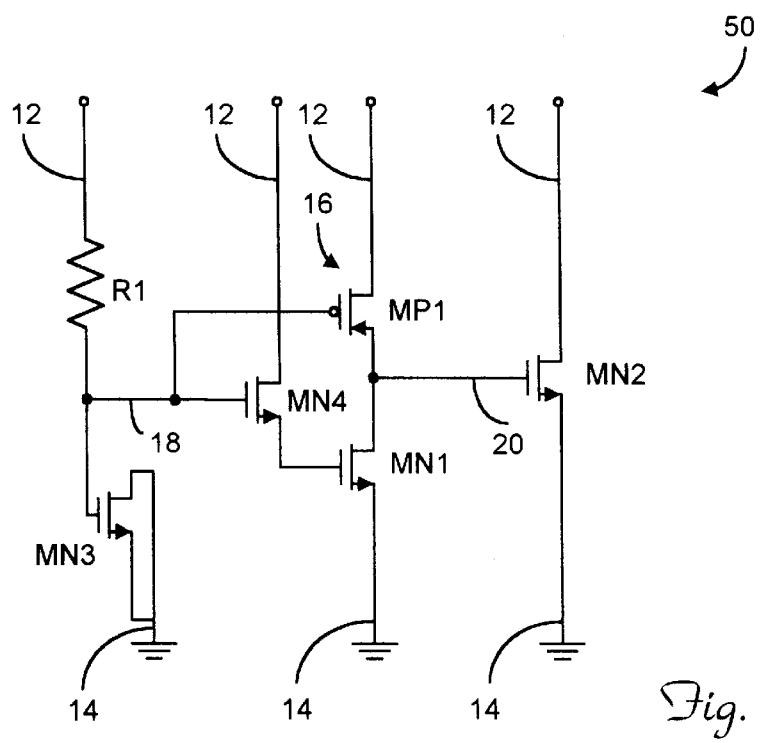
FIG. 2 is a schematic diagram of a power supply ESD protection circuit according to a first embodiment of the present invention.

FIG. 2 is a schematic diagram of a power supply ESD protection circuit 50 according to a first embodiment of the present invention. Circuit 50 significantly reduces the transistor size necessary to achieve the desired load capacitance. The same reference numerals are used in FIG. 2 as were used in FIG. 1 for the same or similar elements. Circuit 50 is similar to circuit 10, but further includes an N-channel transistor MN4 which is coupled as a source-follower, without a load resistance, between node 18 and the gate of transistor MN1. Transistor MN4 has a gate coupled to node 18, a drain coupled to supply terminal 12 and a source coupled to the gate of transistor MN1. Also, load capacitor C1 shown in FIG. 1 is implemented with an N-channel transistor MN3. Transistor MN3 has a gate coupled to node 18 and a drain and source coupled to supply terminal 14.

The gate capacitance of transistor MN1 and junction leakage of transistor MN4 serve as a high impedance load for the source of transistor MN4. The threshold voltage of transistor MN4 combines with the threshold voltage of transistor MN1 to effectively increase the voltage required at node 18 to turn on transistor MN1. During a positive ESD event, node 18 charges up to the threshold voltage of transistor MN3 with a first time constant based on the resistance of resistor R1 and the capacitance of the non-inverted channels of transistors MN3 and MN4. After reaching the N-channel threshold voltage, transistors MN3 and MN4 turn on and node 18 charges with an increased time constant due to the increased capacitance of the inverted channels of transistors MN3 and MN4. Finally, once node 18 charges to the combined threshold voltage of transistors MN4 and MN1, transistor MN1 turns on, pulling node 20 low and turning transistor MN2 off.

Transistor MN4 therefore acts as a voltage level shifting device which prevents transistor MN1 from turning on at the same time as transistor MN3. This allows transistor MN3 to charge above its threshold voltage, which significantly increases its gate capacitance and the time constant at node 18. As a result, transistor MN3 can be fabricated with a much smaller size and still provide the necessary load capacitance. In one embodiment of the present invention, the size of transistor MN3 was reduced by a factor of four in prototype simulations.

In an alternative embodiment, transistors MN3 and MN4 are combined into one transistor that acts as both the capacitive load for resistor R1 and a source-follower for transistor MN1. In this embodiment, transistor MN3 is eliminated and the gate dimensions of transistor MN4 are increased to provide additional capacitive load. In another alternative embodiment, power supply ESD protection circuit 50 includes multiple stages of source-follower transistors MN4 which are coupled together in cascade between node 18 and the gate of transistor MN1 to further reduce the capacitance requirements of transistor MN3. Also, in alternative embodiments, the current source formed by resistor R1 can include any type of current source such as a biased transistor, for example. In addition, each transistor in circuit 50 may include a single transistor or an array of transistors coupled together in parallel.

Figure 3:
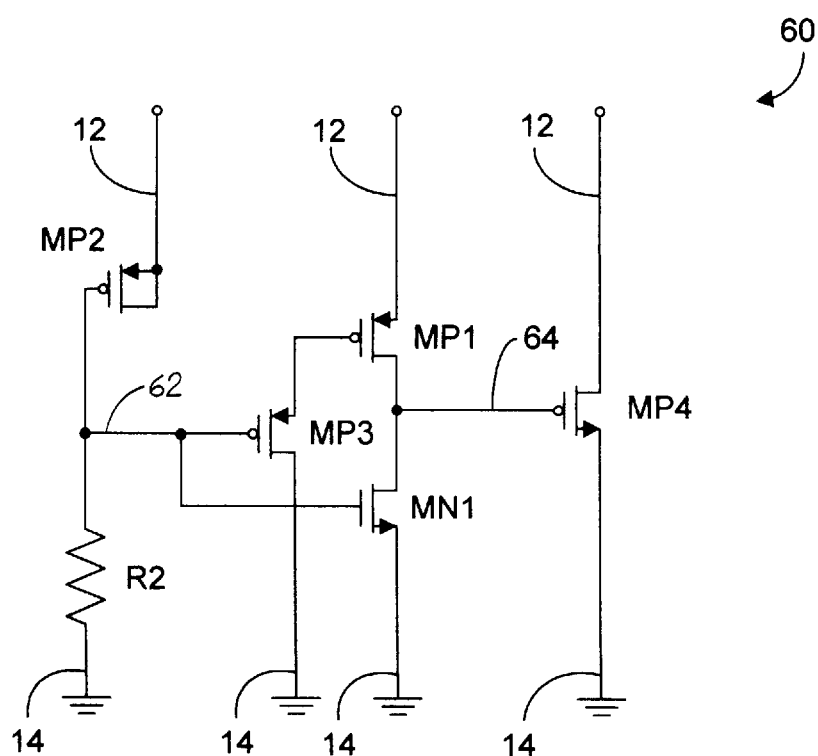
FIG. 3 is a schematic diagram of a power supply ESD protection circuit according to a second embodiment of the present invention.

FIG. 3 is a schematic diagram of an ESD protection circuit 60 according to a second embodiment of the present invention. Circuit 60 is similar to but inverted from the protection circuit shown in FIG. 2. Circuit 60 includes resistor R2, N-channel transistor MN1 and P-channel transistors MP1–MP4. Transistor MP2 is coupled as a capacitor between supply terminal 12 and node 62. Resistor R2 forms a current source and is coupled between node 62 and supply terminal 14.

Transistor MP3 forms a voltage level shifting device and has a gate coupled to node 62, a drain coupled to supply terminal 14 and a source coupled to the gate transistor MP1. Transistor MN1 has a gate coupled to node 62, a drain coupled to node 64 and a source coupled to supply terminal 14. Transistor MP2 has a gate coupled to the source of transistor MP3, a source coupled to supply terminal 12 and a drain coupled to node 64. As in the embodiment shown in FIG. 2, transistors MN1 and MP1 form an inverter having an input at node 62 and an output at node 64. Transistor MP4 is a current shunting transistor and has a gate coupled to node 64, a drain coupled to supply terminal 14 and a source coupled to supply terminal 12.

As supply terminal 12 is charged to a positive voltage relative to supply terminal 14 during an ESD event, current flows through transistor MP2, which initially pulls node 62 high. With node 62 high, transistor MN1 turns on, pulling node 64 low. With node 64 low, transistor MP4 turns on and shunts current from supply terminal 12 to supply terminal 14. As the gate capacitance of transistor MP2 charges through resistor R2, the voltage at node 62 drops at a first time constant based on the resistance of resistor R2 and the gate capacitance of the non-inverted channel of transistor MP2. After the voltage at node 62 drops below the voltage at supply terminal 12 by an amount equal to the P-channel threshold voltage of transistor MP2, the channel of transistor MP2 becomes inverted and the gate capacitance of transistor MP2 increases. Transistor MP2 continues to charge with a larger time constant until the voltage at node 62 drops to the combined threshold voltage of transistors MP3 and MP1. Transistor MP1 turns on which pulls node 64 high and turns off transistor MP4. With the increased time constant at node 62, the size of transistor MP2 can be significantly reduced.

Figure 4:
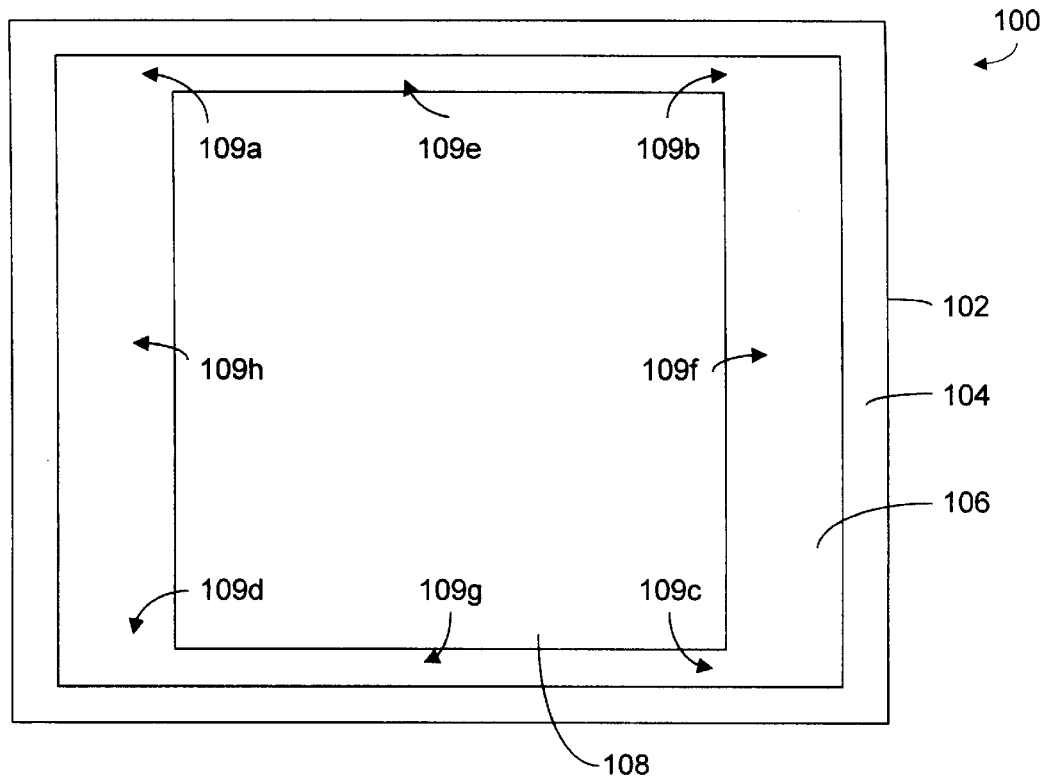
FIG. 4 is a plan view of a semiconductor die in which the circuits shown in FIGS. 2 and 3 can be fabricated.

FIG. 4 is a block diagram of a semiconductor integrated circuit die 100. Die 100 includes perimeter 102, scribe region 104, I/O region 106 and core region 108. I/O region 106 and core region 108 each have a plurality of semiconductor devices or cells. I/O region 106 extends along scribe region 104 and surrounds core region 108. Die 100 has a plurality of routing layers for routing interconnections between the devices within I/O region 12 and core region 14. Each interconnection or "wire" includes one or more segments of conductive material which are routed in a specified pattern within the various routing layers on die 100.

Die 100 includes a plurality of power supply ESD protection circuits of the present invention which are distributed along I/O region 106. For example, a power supply ESD protection circuit can be located at each of the four corners 109a–109d of I/O region 106 and along each of the four sides 109e–109h of I/O region 106 for each pair of power supply buses.

Figure 5:
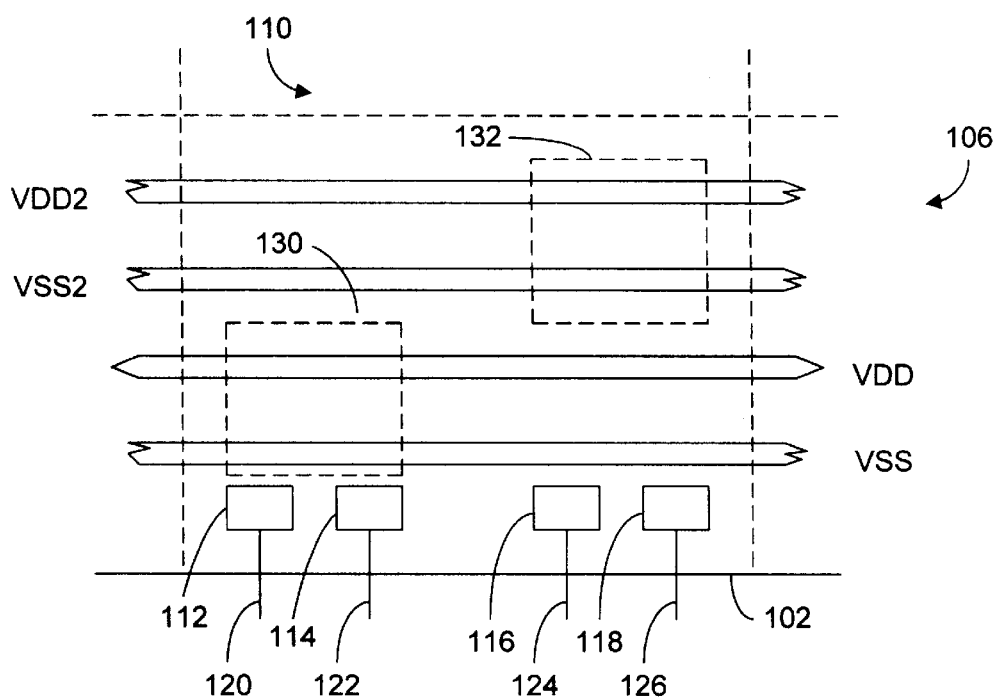
FIG. 5 is a plan view of an I/O cell within an I/O region of the die.

FIG. 5 is a plan view of an I/O cell 110 within I/O region 106. Power supply buses VDD, VSS, VDD2 and VSS2 extend across I/O cell 110 and along I/O region 106, generally parallel to perimeter 102. Buses VDD and VSS supply power to the semiconductor devices within I/O region 106, and buses VDD2 and VSS2 supply power to the semiconductor devices within core region 108. Power and ground pads 112, 114, 116 and 118 are positioned along perimeter 102 and provide a connection to leads 120, 122, 124 and 126 which extend from die 100 to the power and ground pins of the integrated circuit package in which the die is housed. Power and ground pads 112 and 114 are coupled to power supply buses VDD and VSS, respectively. Power and ground pads 116 and 118 are coupled to power supply buses VDD2 and VSS2, respectively.

Power supply ESD protection circuit 130 (shown in phantom) is coupled between power supply busses VDD and VSS to provide protection from ESD events occurring on leads 120 and 122. Power supply ESD protection circuit 132 (also shown in phantom) is coupled between power supply busses VDD2 and VSS2 to provide protection from ESD events occurring on leads 124 and 126. Circuits 130 and 132 are fabricated within the various layers of die 100 in I/O region 106, adjacent the respective power supply busses. Circuit 130 is preferably positioned near power and ground pads 112 and 114, while circuit 132 is preferably positioned near power and ground pads 116 and 118. An advantage of the present invention is that the power supply ESD protection circuit does not require a large load transistor with a large gate capacitance. This allows the circuit to be fabricated within the I/O region of the die, adjacent the respective power supply pads, which may not be possible with larger transistors.

Although the present invention has been described with reference to preferred embodiments, workers skilled in the art will recognize that changes may be made in form and detail without departing from the spirit and scope of the invention. For example, the power supply ESD protection circuit of the present invention can be implemented in various technologies, such as CMOS and BiCMOS. Other technologies may also be used. Various circuit configurations can be used to implement the current source, the load capacitance and the level shifting device. For example the current sources formed by resistors R1 and R2 can include any type of current source such as a biased transistor. Also, the voltage supply rails can be relatively positive or relatively negative, depending upon the particular convention adopted and the technology used. The terms "pull-up" and "pull-down" used in the specification and the claims are arbitrary terms and can refer to either a logic high level or a logic low level. Likewise, the term "coupled" can include various types of connections or couplings and can include a direct connection or a connection through one or more intermediate components.

What is claimed is:

1. An electrostatic discharge (ESD) protection circuit comprising:

first and second supply terminals;

a current source;

a shunt transistor coupled between the first and second supply terminals and having a control terminal;

an inverter comprising an input coupled to the current source, an output coupled to the control terminal of the shunt transistor, and pull-up and pull-down transistors coupled between the first and second supply terminals, the pull-up and pull-down transistors having control terminals which are coupled to the input; and a voltage level shifting device coupled between the input and the control terminal of one of the pull-up and pull-down transistors.

2. The ESD protection circuit of claim 1 wherein the voltage level shifting device comprises a level shifting transistor coupled as a source-follower between the input and the control terminal of one of the pull-up and pull-down transistors.

3. The ESD protection circuit of claim 1 wherein the voltage level shifting device comprises a plurality of level shifting transistors coupled in cascade with one another as source-followers between the input and the control terminal of one of the pull-up and pull-down transistors.

4. The ESD protection circuit of claim 1 and further comprising a charge holding device which is coupled in series with the current source between the first and second supply terminals.

5. The ESD protection circuit of claim 4 wherein the charge holding device comprises a transistor having a source and drain coupled to one of the first and second supply terminals and a gate coupled to the current source.

6. The ESD protection circuit of claim 4 wherein the capacitor comprises a parallel plate capacitor.

7. The ESD protection circuit of claim 1 wherein the current source comprises a resistor.

8. The ESD protection circuit of claim 1 wherein:

the shunt transistor comprises an N-channel shunt transistor having a gate, a drain coupled to the first supply terminal and a source coupled to the second supply terminal;

the pull-up transistor comprises a P-channel pull-up transistor having a gate coupled to the input, a source coupled to the first supply terminal and a drain coupled to the gate of the N-channel shunt transistor;

the pull-down transistor comprises an N-channel pull-down transistor having a gate, a drain coupled to the gate of the N-channel shunt transistor and a source coupled to the second supply terminal; and the level shifting device comprises an N-channel level shifting transistor having a gate coupled to the input, a drain coupled to the first supply terminal and a source coupled to the gate of the N-channel pull-down transistor.

9. The ESD protection circuit of claim 1 wherein:

the shunt transistor comprises an P-channel shunt transistor having a gate, a source coupled to the first supply terminal and a drain coupled to the second supply terminal;

the pull-up transistor comprises a P-channel pull-up transistor having a gate, a source coupled to the first supply terminal and a drain coupled to the gate of the P-channel shunt transistor;

the pull-down transistor comprises an N-channel pull-down transistor having a gate coupled to the input, a drain coupled to the gate of the P-channel shunt transistor and a source coupled to the second supply terminal; and the level shifting device comprises an P-channel level shifting transistor having a gate coupled to the input, a drain coupled to the second supply terminal and a source coupled to the gate of the P-channel pull-up transistor.

10. An integrated circuit die comprising:

a plurality of semiconductor cells;

first and second power supply conductors which have different relative polarities and are electrically coupled to the plurality of semiconductor cells; and an electrostatic discharge (ESD) protection circuit comprising:
  a current source coupled to one of the first and second power supply conductors;
  a shunt transistor coupled between the first and second power supply conductors and having a control terminal;
  an inverter comprising a pull-up transistor and a pull-down transistor which are coupled between the control terminal of the shunt transistor and the first and second power supply conductors, respectively, and which have control terminals which are coupled to the current source; and
  a voltage level shifting device coupled between the current source and the control terminal of one of the pull-up and pull-down transistors.

11. The integrated circuit die of claim 10 wherein the ESD protection circuit further comprises a capacitor coupled in series with the current source between the first and second power supply conductors.

12. The integrated circuit die of claim 11 wherein the capacitor comprises a transistor.

13. The integrated circuit die of claim 10 wherein the capacitor comprises a parallel plate capacitor formed on the integrated circuit die.

14. The integrated circuit die of claim 10 wherein the voltage level shifting device comprises a level shifting transistor coupled as a source-follower between the current source and the control terminal of one of the pull-up and pull-down transistors.

15. An electrostatic discharge (ESD) protection circuit comprising:

first and second supply terminals;

a current source coupled to one of the first and second supply terminals;

a shunt transistor having first and second terminals coupled to the first and second supply terminals, respectively, and having a control terminal; and an inverter formed by a pull-up transistor and a pull-down transistor coupled between the first and second supply terminals and having an input coupled to the current source and an output coupled to the control terminal of the shunt transistor; and means for creating a voltage difference between the inverter input and a control terminal of one of the pull-up and pull-down transistors.

* * * * *